US009164698B2

(12) United States Patent
Walker et al.

(10) Patent No.: US 9,164,698 B2
(45) Date of Patent: Oct. 20, 2015

(54) MEMORY HAVING INTERNAL PROCESSORS AND METHODS OF CONTROLLING MEMORY ACCESS

(71) Applicant: Micron Technology, Inc., Boise, ID (US)

(72) Inventors: Robert M. Walker, Raleigh, NC (US); Dan Skinner, Boise, ID (US); J. Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/269,873

(22) Filed: May 5, 2014

(65) Prior Publication Data

US 2014/0244948 A1    Aug. 28, 2014

Related U.S. Application Data

(63) Continuation of application No. 12/603,393, filed on Oct. 21, 2009, now Pat. No. 8,719,516.

(51) Int. Cl.
*G06F 3/06* (2006.01)
*G11C 7/10* (2006.01)
*G11C 8/12* (2006.01)

(52) U.S. Cl.
CPC ............ *G06F 3/0659* (2013.01); *G06F 3/0604* (2013.01); *G06F 3/0683* (2013.01); *G11C 7/10* (2013.01); *G11C 7/1006* (2013.01); *G11C 8/12* (2013.01)

(58) Field of Classification Search
CPC ... G06F 3/0604; G06F 3/0625; G06F 3/0611; G06F 3/0659; G06F 3/0683; G06F 13/1668; G06F 12/02; G11C 8/12; G11C 7/10; G11C 7/1006

See application file for complete search history.

(56) References Cited

U.S. PATENT DOCUMENTS

| | | | |
|---|---|---|---|
| 5,131,082 A | 7/1992 | Bonevento et al. | |
| 5,452,427 A | 9/1995 | Tobita et al. | |
| 5,634,073 A * | 5/1997 | Collins et al. | 711/141 |
| 6,298,413 B1 | 10/2001 | Christenson | |
| 6,345,348 B2 * | 2/2002 | Watanabe et al. | 711/170 |
| 6,629,234 B1 | 9/2003 | Col | |
| 6,810,449 B1 * | 10/2004 | Barth et al. | 710/61 |
| 6,857,055 B2 | 2/2005 | Jeddeloh | |
| 6,877,046 B2 | 4/2005 | Singh | |
| 8,234,460 B2 | 7/2012 | Walker | |

(Continued)

FOREIGN PATENT DOCUMENTS

CN    1825466 A    8/2006
EP    1437660      7/2004

*Primary Examiner* — Michael Krofcheck
(74) *Attorney, Agent, or Firm* — Fletcher Yoder, P.C.

(57) ABSTRACT

Memories having internal processors and methods of data communication within such memories are provided. One such memory may include a fetch unit configured to substantially control performing commands on a memory array based on the availability of banks to be accessed. The fetch unit may receive instructions including commands indicating whether data is to be read from or written to a bank, and the address of the data to be read from or written to the bank. The fetch unit may perform the commands based on the availability of the bank. In one embodiment, control logic communicates with the fetch unit when an activated bank is available. In another implementation, the fetch unit may wait for a bank to become available based on timers set to when a previous command in the activated bank has been performed.

20 Claims, 4 Drawing Sheets

(56) References Cited

U.S. PATENT DOCUMENTS

| | | |
|---|---|---|
| 8,380,916 B2 | 2/2013 | Walker |
| 2003/0079077 A1* | 4/2003 | Piau et al. .................... 711/103 |
| 2003/0088751 A1* | 5/2003 | Wu et al. ....................... 711/167 |
| 2003/0188086 A1 | 10/2003 | Singh |
| 2004/0034749 A1 | 2/2004 | Jeddeloh |
| 2006/0129740 A1 | 6/2006 | Ruckerbauer et al. |
| 2007/0130428 A1 | 6/2007 | Ohba |
| 2010/0312997 A1 | 12/2010 | Walker |
| 2010/0312998 A1 | 12/2010 | Walker |
| 2010/0312999 A1 | 12/2010 | Walker |
| 2010/0313000 A1 | 12/2010 | Walker |
| 2011/0093662 A1 | 4/2011 | Walker et al. |

* cited by examiner

MEMORY HAVING INTERNAL PROCESSORS AND METHODS OF CONTROLLING MEMORY ACCESS

CROSS-REFERENCE TO RELATED APPLICATION

This application is a continuation of and claims priority to U.S. patent application Ser. No. 12/603,393, which was filed on Oct. 21, 2009, now U.S. Pat. No. 8,719,516, which issued May 6, 2014 and is herein incorporated by reference.

BACKGROUND

1. Field of Invention

Embodiments of the invention relate generally to memory systems, and more particularly, to memory systems having internal processors.

2. Description of Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light and not as admissions of prior art.

Electronic systems typically include one or more processors, which may retrieve and execute instructions, and store the results of the executed instruction, such as to store the results to a suitable location. A processor may generally use arithmetic logic unit (ALU) circuitry to execute instructions, such as arithmetic and logic operations, on data, such as one or more operands. For example, the ALU circuitry may add, subtract, multiply, or divide one operand from another, or may subject one or more operands to logic operations, such as AND, OR, XOR, and NOT logic functions. A processor may execute instructions having different degrees of complexity, and different instructions may involve inputting the operand(s) through the ALU circuitry in one or multiple clock cycles.

A number of components in the electronic system may be involved in directing a set of instructions to the ALU for execution. In some devices, the instructions may be generated by a controller, or some other suitable processor in the electronic system. Data (e.g., the operands on which the instructions will be executed, as well as the instructions) may be stored in a memory component (e.g., a memory array) that is accessible by the ALU. The instructions and data may be retrieved from the memory and sequenced and/or buffered before the ALU begins to execute instructions on the data. Furthermore, as different types of operations may be executed in one or multiple clock cycles through the ALU, intermediate results of the instructions and/or data may also be sequenced and/or buffered.

Typically, a processor (e.g., the ALU circuitry) may be external to the memory array, and data must be accessed via a bus between the processor and the memory array to execute a set of instructions. As processing speed may be limited by the bandwidth of the bus, processing performance may be improved in a processor-in-memory (PIM) device, where the processor is implemented internal to a memory (e.g., directly on the memory), conserving time and power in processing. Furthermore, the memory may also be configured to execute instructions with little or no external assistance, further saving on processing power.

BRIEF DESCRIPTION OF DRAWINGS

Certain embodiments are described in the following detailed description and in reference to the drawings in which.

DETAILED DESCRIPTION

Figure 1:
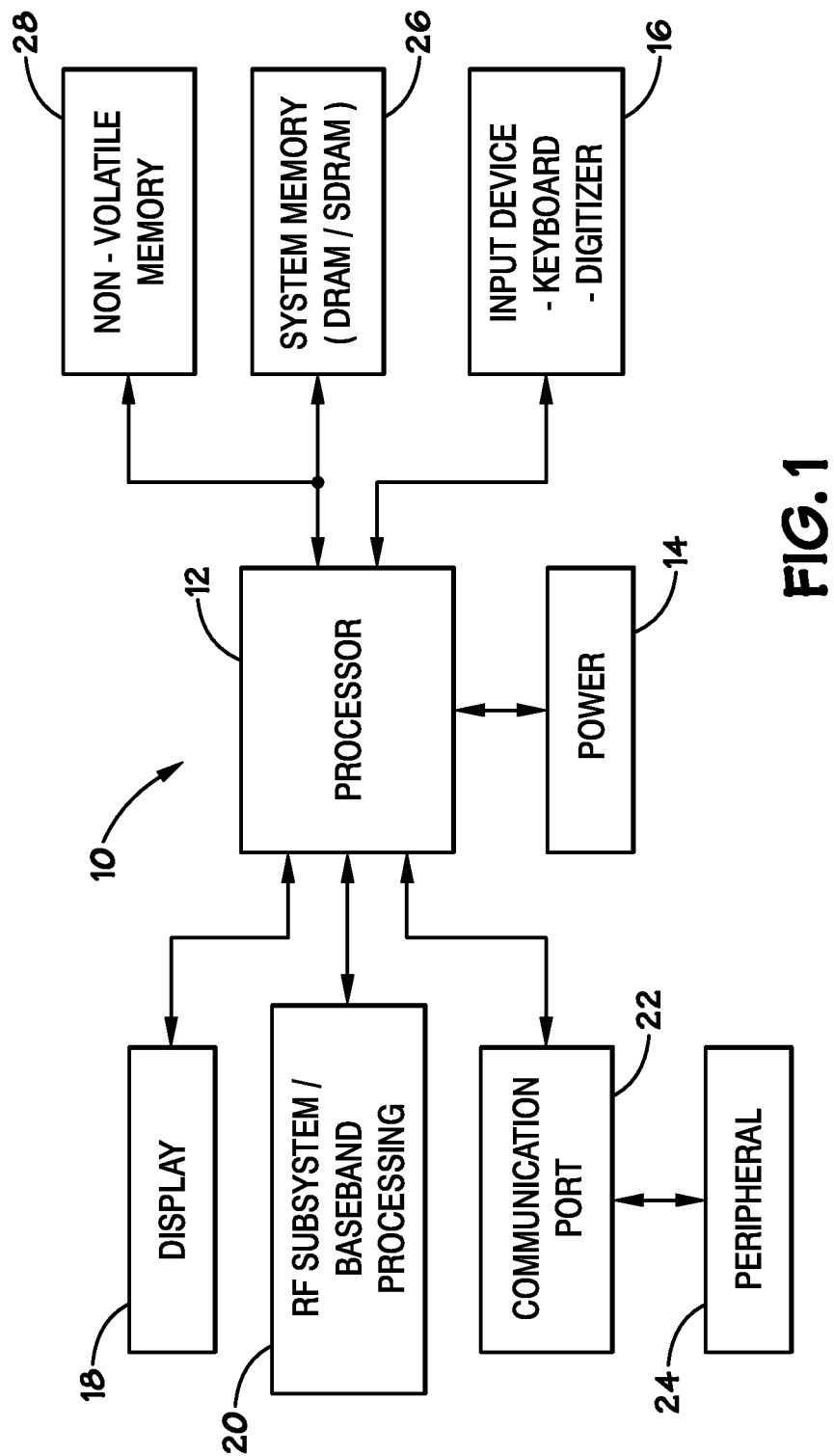
FIG. 1 depicts a block diagram of a processor-based system in accordance with an embodiment of the present technique.

An electronic device may generally use a processor to process instructions in multiple stages. Processing the instructions may include executing the instructions, and storing the results of the executed instructions. For example, instructions, and the data on which the instructions will be executed, may be sent by an external processor (e.g., a memory controller) to an internal processor (e.g., ALU circuitry). The instructions and/or data may first be stored in a memory array to be retrieved when the internal processor is available to execute the instructions. Once the instruction(s) have been executed, the internal processor may store the results of the instruction(s) in a memory component, the memory array, or to any other suitable output.

A processor that is external to the memory may require an external bus to transfer information (e.g., instructions and/or data) to and from the memory array. Processing efficiency may be partly limited by the bandwidth of the external bus, as transferring information between a memory array and a processor may consume power and time. In one or more embodiments, a memory may conserve power by allowing information to be transferred between the memory array and a processor without an external bus.

In accordance with the present techniques, one or more processors, such as ALUs, may be packaged with a memory component in the memory. For example, the memory may be a processor-in-memory (PIM), and may include ALUs embedded on a memory device (e.g., a memory array), which may store instructions and data to be executed by the ALUs and the results from the executed instructions. In other embodiments, the ALUs and the memory array may be on unique dies in the same package. For example, the ALUs and the memory array may be arranged in a multi-chip package (MCP), and may be electrically connected by one or more through-silicon vias (TSVs). Processors which are packaged with a memory device (whether embedded on a memory device or as part of a MCP, for example), may be referred to as "internal processors," and thus a memory device packaged with a processor may be considered a memory "having" an internal processor. As used herein, a "compute engine" may be an example of an internal processor, and may be packaged with a memory device in accordance with the present techniques. Further, an internal processor, such as a compute engine, may comprise one or more ALUs.

The memory may also include components such as a sequencer to organize the instructions and data, a fetch unit to access data from the memory array, and a buffer to store (e.g., hold) data and/or instructions. The buffer may also hold intermediate results or final results before they are transferred to the memory array. In one embodiment, the sequencer may arbitrate access to the memory array, or may communicate with a processor external to the memory (i.e., an external processor) which arbitrates access to the array. In one or more embodiments, the fetch unit may also arbitrate access to the memory array. Internal arbitration of the memory array on the memory may enable the memory to process instructions with little or no assistance from external devices, such as external processors.

One embodiment of the present technique involves a memory configured to process instructions with reduced communication with other devices or processors external to the memory. More specifically, certain components, such as a sequencer and a fetch unit, may read and write data and organize the performance of operations with substantially no external control or external data transfer. Decreasing the amount of external communication may allow a memory to have fewer external bus lines, or external bus lines with reduced widths. Further, decreasing the amount of external communication may reduce processing power, as power-consuming data transfers into and out of the memory may be saved.

Now turning to the figures, FIG. 1 depicts a processor-based system, generally designated by reference numeral 10. As is explained below, the system 10 may include various electronic devices manufactured in accordance with embodiments of the present technique. The system 10 may be any of a variety of types such as a computer, pager, cellular phone, personal organizer, control circuit, etc. In a typical processor-based system, one or more processors 12, such as a microprocessor, control the processing of system functions and requests in the system 10. As is explained below, the processor 12 and other subcomponents of the system 10 may include memory manufactured in accordance with one or more embodiments of the present technique.

The system 10 typically includes a power supply 14. For instance, if the system 10 is a portable system, the power supply 14 may advantageously include a fuel cell, a power scavenging device, permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, an input device 16 may be coupled to the processor 12. The input device 16 may include buttons, switches, a keyboard, a light pen, a mouse, a digitizer and stylus, and/or a voice recognition system, for instance. A display 18 may also be coupled to the processor 12. The input device 16 and/or the display 18 may each or both form a user interface. The display 18 may include an LCD, an SED display, a CRT display, a DLP display, a plasma display, an OLED display, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by processing programs stored in the memory. The software programs may include an operating system, database software, drafting software, word processing software, and/or video, photo, or sound editing software, for example. The memory is operably coupled to the processor 12 to store and facilitate execution of instructions to implement various programs. For instance, the processor 12 may be coupled to the system memory 26, which may include dynamic random access memory (DRAM), and/or synchronous dynamic random access memory (SDRAM). The system memory 26 may include volatile memory, non-volatile memory, or a combination thereof. The system memory 26 is typically large so that it can store dynamically loaded applications and data.

The processor 12 may also be coupled to non-volatile memory 28, which is not to suggest that system memory 26 is necessarily volatile. The non-volatile memory 28 may include read-only memory (ROM), such as an EPROM, resistive read-only memory (RROM), and/or flash memory to be used in conjunction with the system memory 26. The size of the ROM is typically selected to be just large enough to store any necessary operating system, application programs, and fixed data. Additionally, the non-volatile memory 28 may include a high capacity memory such as a tape or disk drive memory, such as a hybrid-drive including resistive memory or other types of non-volatile solid-state memory, for instance.

Figure 2:
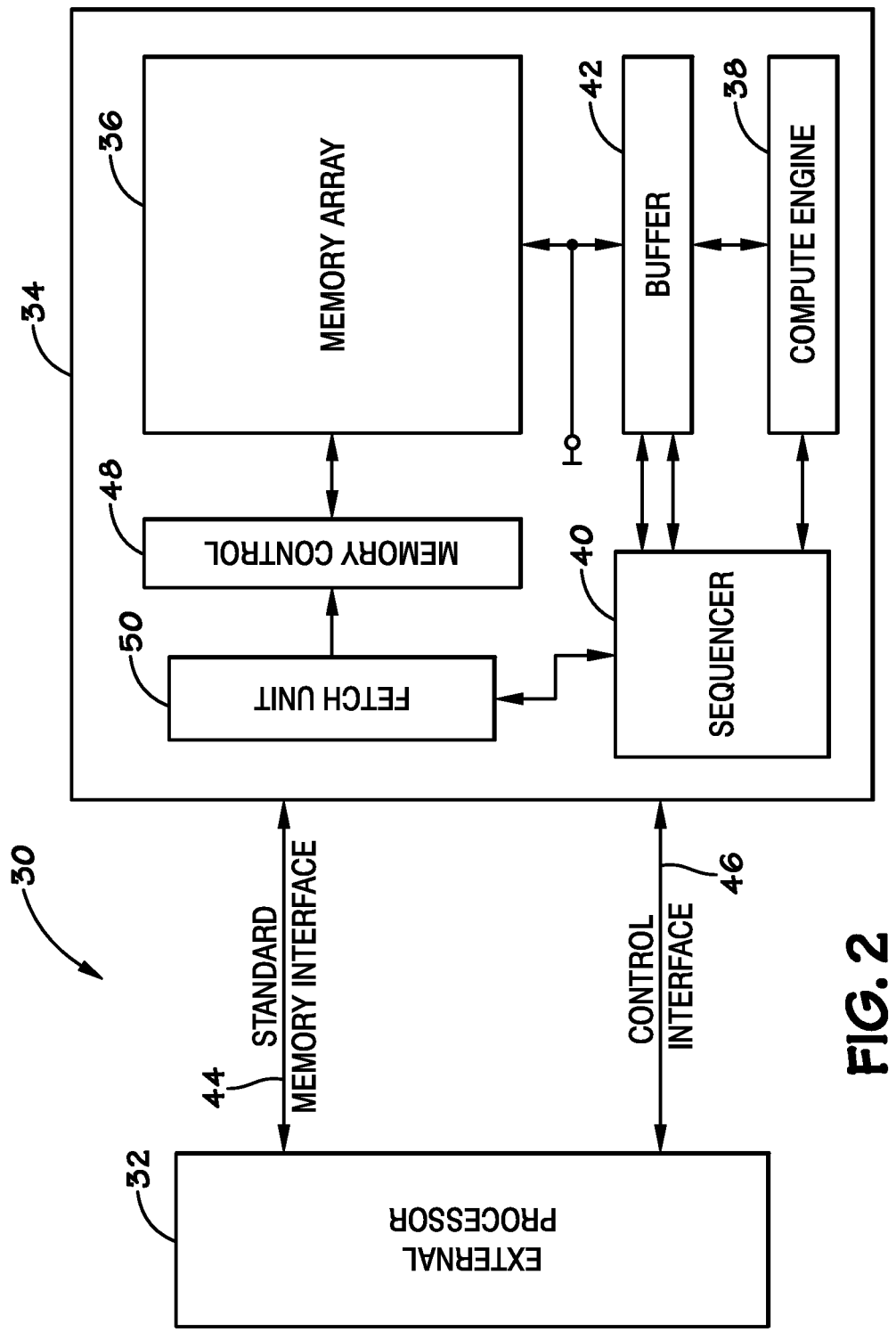
FIG. 2 depicts a block diagram of a memory system having an internal processor interfaced with an external processor, in accordance with an embodiment of the present technique.

Some embodiments of the present technique involve communication between the processor 12 and components of the system memory 26. For example, the processor 12 may include a general purpose processor, a central processing unit, a processor core, an ASIC, a memory controller, and/or an ALU, for example, capable of sending and receiving signals from internal processors of memory, such as memory devices in the system memory 26. Components of the system 10 involved in the communication between the processor 12 and the components of a memory such as system memory 26 may be generally referred to as a "memory system" 30, as illustrated in the block diagram of FIG. 2. In some embodiments, a memory system 30 may include a memory device 34, which may be part of the system memory 26 of the system 10 (as in FIG. 1) and may have an internal processor such as the compute engine 38. The memory system 30 may also include an external processor 32, which may be in a system-on-a-chip (SOC) with a more general purpose processor to collectively form a processor 12 of a processor-controlled system 10 (as in FIG. 1). The external processor 32, which may also be an external memory controller, may communicate with and/or control certain components of a memory device 34.

The memory system 30 may include components which have functions that are not limited to the communication between the external processor 32 and the memory device 32. For example, the external processor 32 may control devices in addition to the memory device 34. However, the external processor 32, as explained with respect to the memory system 30, may refer to one function of the external processor 32 which communicates with and/or controls certain components of the memory device 34. Likewise, not all parts of the system memory 26 may be part of the memory system 30. The "memory device" 34 may refer to components of the memory system involved in the communication with the external processor 32, in accordance with the present techniques.

The external processor 32 and the memory device 34 may be operably coupled by a standard memory interface 44 which may allow data transfer between the external processor 32 and the memory device 34, and may allow the external processor 32 to send (e.g., transfer) commands to the memory device 34. In one or more embodiments, the types of standard memory interface 44 may include DDR, DDR2, DDR3, LPDDR, or LPDDR2, for example. Further, in some embodiments, an additional interface(s) may be configured to allow the transfer of data, and also commands (e.g., requests, grants, instructions, etc.), between the memory device 34 and the external processor 32. For example, the external processor 32 and the memory device 34 may also be operably coupled by a control interface 46, which may allow the transfer of commands between the external processor 32 and the memory device 34, including commands from the memory device 34 to the external processor 32.

A memory, such as a memory device 34, may be configured to substantially process instructions (including executing the instructions and storing the completed results) may have reduced communication with the external processor 32. While access to a memory array 36 on the memory device 34 may typically be controlled by the external processor 32, in one or more embodiments, the processing of instructions, including memory array access, may be substantially controlled within the memory device 34. For example, once the external processor 32 sends instructions to the memory array 36, the processing of the instructions, including accessing the memory array 34 to read and/or write data, may occur largely within the memory device 34.

The memory array 36, which may refer to any suitable form of storage, and may include, for example, a DRAM array or an SDRAM array. In one or more embodiments, the memory array 36 may store data, instructions to be executed on the data, and completed results of executed instructions. The memory array 36 may be accessed by certain components in the memory system 30, which may access the array to read instructions and/or data, write completed results, etc. Typically, only one command (e.g., reading and/or writing) may be performed in a bank of the memory array 36 at one time. Thus, access to the memory array 36 may be arbitrated such that commands in memory array banks do not conflict.

The memory device 34 may also include an internal processor, such as a compute engine 38, which may include one or more arithmetic logic units (ALUs). Further, the compute engine 38 may refer to a plurality of compute engines 38 on the memory device 34. The compute engine 38 may be configured to perform operations on data. In one embodiment, the compute engine 38 may include one or more ALU blocks configured to perform various mathematical or logical operations on data, such as operands or intermediate results of previous operations.

The compute engine 38 may be controlled by a sequencer 40, which may be capable of accessing the memory array 36, including retrieving information (e.g., reading instructions and/or data) from, and storing information (e.g., writing completed results) in the memory array 36. The process of retrieving and storing information may also involve a fetch unit 50, a memory control 48, and a memory component, such as the buffer 42. The sequencer 40 may transfer command information and the data address to the fetch unit 50, and the fetch unit 50 may sequence the memory array 36 states to read and write data. In one embodiment, the memory control 48 may decode the command and address bits received by the fetch unit 50 from the sequencer 40.

Once the compute engine 38 has executed the instructions, the results may be stored in the buffer 42 before they are written to the memory array 36. Further, as some instructions may require more than one clock cycle in the compute engine and/or require multiple operations to be performed, intermediate results may also be stored in memory components in the memory device 34. For example, intermediate results may be stored in memory components such as the buffer 42 or memory registers coupled to the compute engine 38. In one or more embodiments, a compute engine 38 may access the buffer 42 for the intermediate results to perform subsequent operations.

The buffer 42 may include one or more layer of buffers. For example, and as will be further discussed with reference to FIG. 3, the buffer 42 may include a compute buffer 54, which may store data (e.g., operands, intermediate results, completed results, etc.), and an instruction buffer, which may store instructions transferred from the memory array 36. The buffer 42 may also include additional buffers, such as a data buffer or a simple buffer, which may provide denser storage, and may store intermediate or final results of executed instructions. As used herein, "buffer 42" may refer to any type of buffer layer (e.g., a compute buffer, instruction buffer, data buffer, etc.), or any type of memory capable of holding data and/or instructions transferred to and from the compute engine 38.

As discussed, memories having internal processors have improved processing capabilities because internal communication within a memory, e.g., between an internal processor and a memory array, may reduce power consumption and processing time. In one or more embodiments, the memory systems 30 having memory devices 34 configured to substantially process instructions within the memory device 34 may further improve processing capabilities. More specifically, the memory device 34 may be configured to arbitrate access to the memory array 36 on the device 34.

Figure 3:
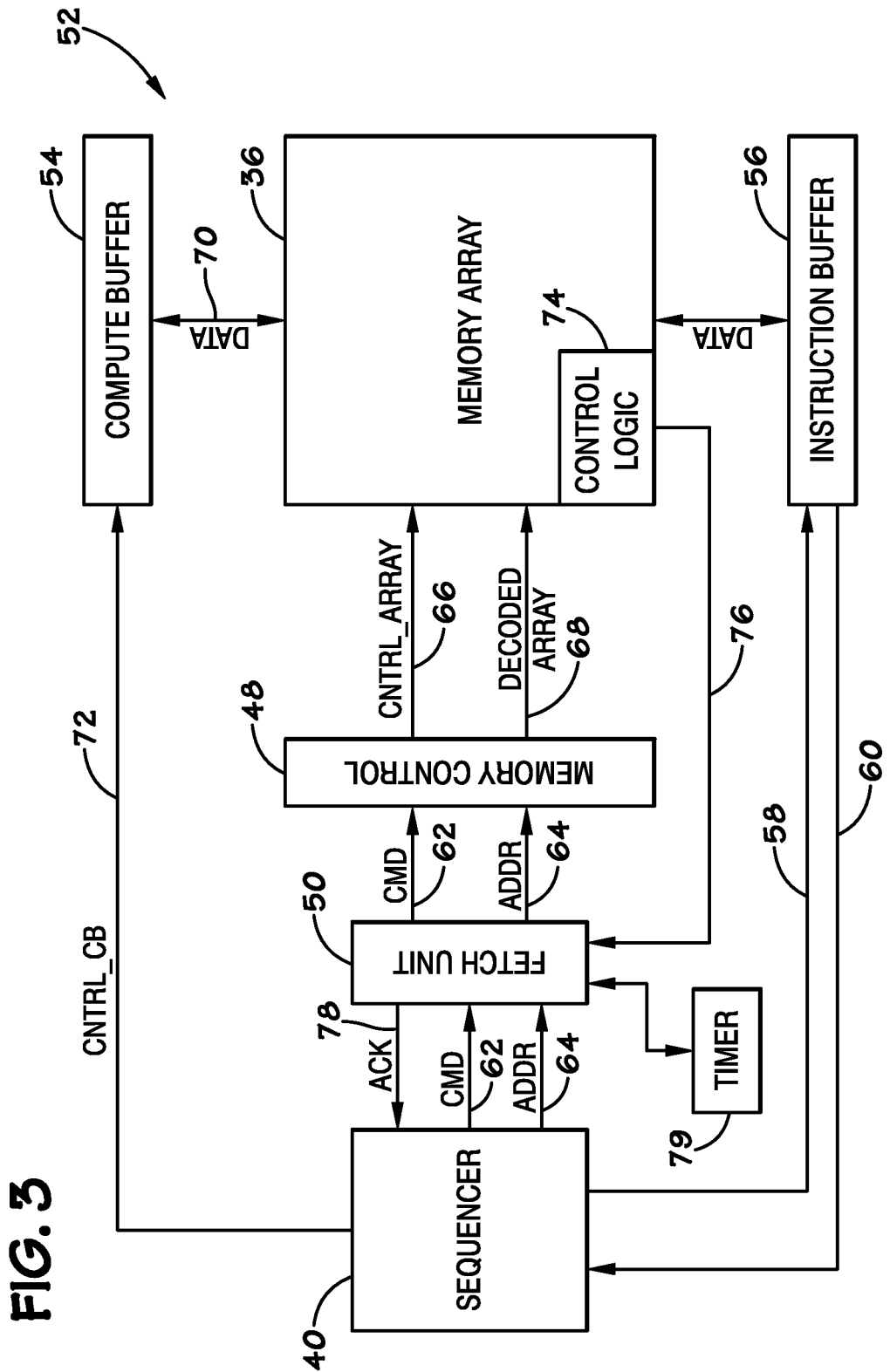
FIG. 3 illustrates a portion of a memory having an internal processor and communication pathways between different components of the memory, in accordance with one or more embodiments of the present technique.
Figure 4:
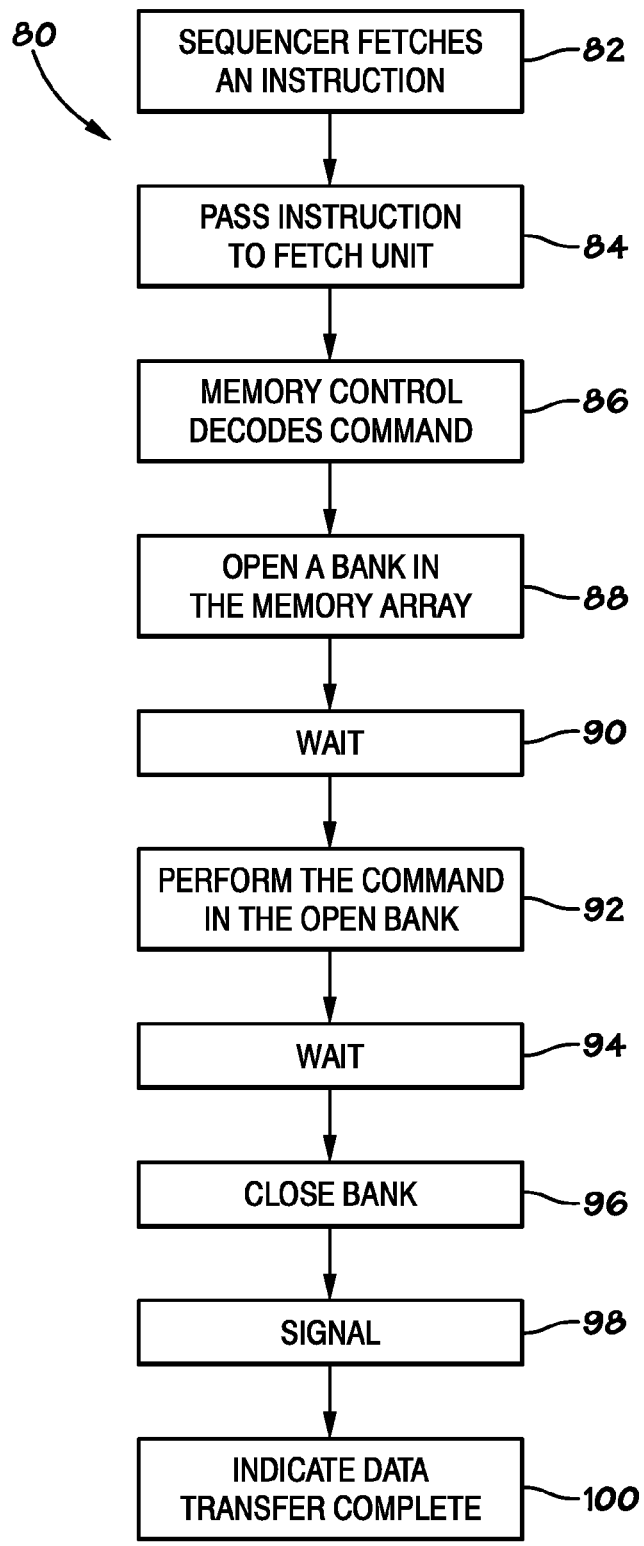
FIG. 4 is a flow chart depicting a process for accessing a memory array in a memory having an internal processor, in accordance with one or more embodiments of the present technique.

A process for arbitrating memory array access may be depicted in the memory device portion 52 of FIG. 3, which illustrates possible communications between different components of the memory device portion 52. Furthermore, a process 80 for arbitrating memory array access in a memory device 34 may also be explained in the flow chart of FIG. 4. As FIG. 4 may explain memory device components and communications depicted in FIG. 3, FIGS. 3 and 4 may be discussed concurrently.

The process 80 may start when the sequencer 40 fetches an instruction from an instruction buffer 56 (block 82). In one embodiment, the instruction may have been transferred to the memory array 36 externally, such as by an external processor 32 (as in FIG. 2), and buffered in the instruction buffer 56. The instruction the may include operations to be performed on data, commands to either read or write data to the memory array 36, as well as data addresses (e.g., the bank and page in the memory array 36 where the data is located). The sequencer may retrieve an instruction by sending a control signal 58 to the instruction buffer 56 to identify the rows in the instruction buffer from which the instructions are to be retrieved. The instructions may be transferred (path 60) to the sequencer 40.

In one or more embodiments, the instructions may be either direct or indirect. A direct instruction may include multiple commands, such as commands for organizing the operations to be performed on the data, commands for reading or writing the data, and/or addresses of the data. For example, direct instructions may include commands to read or write data from the memory array 36, addresses in the memory array 36 for the data (e.g., where to read operand A and an operand B), as well as commands which tell the sequencer 40 how to organize certain operations for the operands A and B. An indirect instruction may include comparatively simpler commands, which may be transferred to the sequencer 40 one command at a time. For example, an indirect instruction may include one command to fetch an operand A from the memory array 36, another command to fetch an operand B from the memory array 36, a third command to organize certain operations for the operands A and B, and a fourth command used to identify an address in the array 36 where completed results may be stored. While direct instructions may increase processing speed, as all parts of a direct instruction (e.g., the different commands of the indirect instruction) are transferred together, indirect instructions may enable a simpler memory device 34. For example, in a memory device 34 configured to transfer indirect instructions, the sequencer 40 may be simpler, the bus 60 may not need to be as wide, and/or the instruction buffer 56 may not need to be as wide as an instruction buffer 56 transferring direct instructions.

The instructions transferred by the instruction buffer 56 may include commands to read data (e.g., operands) from or write data (e.g., completed results) to the memory array 36. For example, the instructions may command the sequencer 40 to retrieve certain operands stored at some address (e.g., a particular bank and row) in the array 36. Alternatively, as some instructions may be executed using intermediate results of previous operations, the instructions may include the address of intermediate results to be retrieved from the compute buffer 42. If the instructions are executed using intermediate results, the sequencer 40 may not need to access the memory array 36.

If the instructions command the sequencer 40 to access operands that are stored in the memory array 36, access to the array 36 may be arbitrated to prevent corruption of the memory array 36, which may occur if more than one command (e.g., reading and writing) are occurring within the same bank of the array 36 at once. In one or more embodiments, the memory device 34 may be configured such that arbitration of memory array access may be performed within the memory device 34. In one embodiment, the sequencer 40 may control memory array arbitration, and may communicate externally (e.g., with the external processor 32) to arbitrate memory array access. However, communication with external devices may be substantially reduced. For example, access to the memory array 36 may be substantially controlled by the fetch unit 50 in the memory device 34.

The process 80 depicts memory array access that is substantially controlled by the fetch unit 50. Once the sequencer 40 receives the instructions, the sequencer 40 may transfer the instructions, including the command 62 and the address 64 to the fetch unit 50 (block 84). In one embodiment, the fetch unit 50 may transfer the commands 62 and addresses 64 to the memory control 48, which decodes the instructions into the decoded address 68 and the control signal 66 (block 86). The decoded address 68 and control signal 66 may command the reading or writing of data from the proper addresses (e.g., a certain bank, page, and/or row). The fetch unit 50 may then activate (e.g., open) the bank holding the data or the bank to which data is to be written (block 90).

The fetch unit 50 may substantially control access to the memory array to prevent more than one command (e.g., reading or writing data) from being performed on the same bank of the memory array 36. Such arbitration of accessing the memory array 36 may have various implementations in accordance with the present techniques. In one embodiment, the memory array 36 may include control logic 74, which may be configured to monitor when a page in the array 36 is open or closed. The control logic 74 may engage in "handshaking," which may refer to sending a control signal 76 to the fetch unit 50 indicating a status of a bank of interest (i.e., the bank to which the fetch unit 50 is commanded to read from or write to). The fetch unit 50 may wait for the signal 76 before performing commands on the bank of interest (block 90).

If the bank of interest is available (e.g., commands are not being performed on the bank of interest), the fetch unit 50 may perform the command(s) of reading from and/or writing to the bank of interest (block 92). If the instructions received at the sequencer 40 included commands to read data, the fetch unit may retrieve the data from the bank of interest and transfer the data to the compute buffer 54, such that the data will be available for a compute engine 38 to execute instructions on the data. Further, if the instructions received at the sequencer 40 include commands to write data to the memory array, the fetch unit 50 may write the data (e.g., completed results) at the commanded address in the memory array 36.

Once the commands are performed (block 92), the control logic 74 of the memory array 36 may send a signal 76 to the fetch unit 50 to indicate that the commands have been performed on the bank of interest (block 94). The fetch unit 50 may then precharge (e.g., close) the bank of interest on the memory array 36 (block 96), and the control logic 74 may send a signal 74 acknowledging that the bank of interest has been closed (block 98). The fetch unit 50 may send a signal 78 indicating to the sequencer 40 that the command has been performed, and that the data has been either retrieved or stored to the proper address(es) in the memory array 36 (block 100). The data may be transferred (path 70) to the compute buffer 54, which may hold the data until the compute engine 38 (as in FIG. 2, not depicted in FIG. 3) uses the data to execute instructions.

As discussed, different implementations may be used for arbitration of memory array access. In another embodiment, the fetch unit 50 may time the performance of commands (e.g., reading or writing) based on timers 79. The timers 79 may be based on clock cycles of how long data transfers to and from the memory array 36 typically take. For example, after a bank is open in the memory array (block 88) and before performing commands on the bank, a timer 79 may be activated, and the fetch unit 50 may wait until the time conditions set by the timer 79 are met to ensure that no other commands are being performed on the bank of interest (block 90). Once the timer conditions are met, the fetch unit 50 may begin to read from or write to the bank of interest (block 92). Based on the command to be performed, another timer may be set to indicate when the command would complete. The fetch unit 50 may wait for the command completion timer to be met before precharging (closing) the bank in the memory array 36. Furthermore, in one embodiment, a timer 79 may be activated when the fetch unit begins to perform a command on a bank, based on when the command is estimated to complete. Future accesses to that bank may be based on the activated timer 79 from the previous command. In one or more embodiments, timers 79 such as tRCD, tRP, etc. may be used to set an appropriate amount of time before the fetch unit 50 performs commands or closes the bank of interest.

While the process 80 explains the processing of instructions which include reading and/or writing to the memory array 36, the sequencer 40 may also receive instructions which do not include accessing the memory array 36. For example, the sequencer 40 may receive instructions which may be executed using intermediate results of previous operations or instructions, which may already be buffered in some row of the compute buffer 54. Rather than performing the previously discussed process 80, the sequencer 40 may send a control signal 72 to the compute buffer 54 to identify the row(s) in the compute buffer 54 on which the intermediate results are located. As the data is already in the compute buffer 54, transfers between the compute buffer 54 and the memory array 36 may not occur for performing operations where operands are already buffered in the compute buffer 54 as intermediate results from previous operations.

Furthermore, as discussed, the buffer 42 (as in FIG. 2) may include one or more layers, which may be partitioned and/or have different busses to components of the memory device 34. The buffer 42 may include an instruction buffer 56 and a compute buffer 54, which are illustrated in FIG. 3 as separate buffers 42, each having individual buses to the sequencer 40 and the memory array 36. However, the separate buffers 54 and 56 in FIG. 3 may also be one buffer 42 having layers for storing data and instructions, and having a shared bus between the buffer 42 (e.g., combined buffers 54 and 56) and the memory array 36 and/or the sequencer 40.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory comprising:
    a memory array comprising one or more memory banks, wherein the memory array is configured to store data in the one or more memory banks;
    an internal processor configured to receive the data stored in the memory array and to perform a first operation on the data; and
    a fetch unit configured to receive an instruction comprising an address in the memory array and a command to perform a second operation at the address to facilitate the internal processor perform the first operation, and to substantially control access to the memory array by ensuring only one operation at a time is performed on a specific memory bank comprising the address, wherein the fetch unit is external to the internal processor.

2. The memory of claim 1, comprising a memory control device communicatively coupled to the fetch unit, wherein the memory control device is configured to receive the command and the address in the memory array from the fetch unit and to decode the command and the address, wherein the memory control is separate from the fetch unit.

3. The memory of claim 1, wherein the fetch unit is configured to perform the second operation by reading data from the address or writing data to the address.

4. The memory of claim 1, wherein the fetch unit is configured to perform the second operation by activating and precharging the specific memory bank.

5. The memory of claim 1, comprising control logic communicatively coupled to the fetch unit, wherein the fetch unit is configured to ensure only one command is performed at a time on the specific memory bank based at least in part on a control signal transmitted to the fetch unit from the control logic indicating that performance of the operation is complete.

6. The memory of claim 1, comprising a timer communicatively coupled to the fetch unit, wherein the timer is configured to indicate when the specific memory bank is available.

7. The memory of claim 1, comprising a timer communicatively coupled to the fetch unit, wherein the timer is configured to indicate when the operation has been performed.

8. A memory comprising:
    a memory array comprising one or more memory banks, wherein the memory array is configured to store data in the one or more memory banks;
    an internal processor configured to receive the data stored in the memory array and to perform a first operation on the data; and
    a sequencer configured to retrieve an instruction from an instruction buffer and to transfer the instruction to a fetch unit, wherein the instruction comprises an address in the memory array and a first command to perform a second operation at the address to facilitate the internal processor perform the first operation, the fetch unit is configured to substantially control access to the memory array, and the sequencer is external to the internal processor.

9. The memory of claim 8, comprising a memory control device communicatively coupled to the fetch unit, wherein the memory control device is configured to receive the first command and the address in the memory array from the fetch unit and to decode the command and the address, wherein the memory control device is separate from the fetch unit.

10. The memory of claim 8, wherein the instruction comprises a second command to perform a third operation on the memory array, wherein the sequencer is configured to organize performance of the second operation and the third operation.

11. The memory of claim 10, wherein the instruction comprises a third command describing organization of performance of the second operation and the third operation.

12. A method comprising:
    receiving an instruction by a fetch unit of memory, wherein the memory comprises an internal processor configured to receive data stored in the memory and to perform a first operation on the data, the instruction comprises an address in the memory array and a command to perform a second operation at the address, wherein the fetch unit is configured to substantially control access to the memory array;
    transferring the instruction from the fetch unit to a memory control device of the memory, wherein the fetch unit is separate from the memory control device;
    decoding the instruction into a decoded address and a control signal using the memory control device; and
    performing the second operation using the fetch unit based at least in part on the decoded address and the control signal to facilitate the internal processor perform the first operation.

13. The method of claim 12, wherein the fetch unit and the memory control device are external to the internal processor.

14. The method of claim 12, comprising receiving a first control signal from control logic indicating that performance of the second operation is complete.

15. The method of claim 14, comprising receiving a second control signal from the control logic indicating that a memory bank associated with the address has been closed.

16. The method of claim 12, comprising activating a first timer of the memory, wherein the first timer sets a time when the fetch unit may begin performing the second operation.

17. The method of claim 16, comprising activating a second timer of the memory, wherein the second timer sets a time when performance of the first second operation is complete.

18. The method of claim 12, comprising:
    sequencing performance of the second operation and a third operation using a sequencer, wherein the sequencer is external to the internal processor; and
    performing the third operation using the fetch unit.

19. The method of claim 12, wherein performing the second operation comprises reading data from the address or writing data to the address using the fetch unit.

20. The method of claim 12, wherein performing the second operation comprises activating a memory bank corresponding with the address and precharging the memory bank using the fetch unit.

* * * * *